United States Patent
Langhammer

(10) Patent No.: US 7,590,676 B1
(45) Date of Patent: Sep. 15, 2009

(54) PROGRAMMABLE LOGIC DEVICE WITH SPECIALIZED MULTIPLIER BLOCKS

(75) Inventor: Martin Langhammer, Alderbury (GB)

(73) Assignee: Altera Corporation, San Jose, CA (US)

( * ) Notice: Subject to any disclaimer, the term of this patent is extended or adjusted under 35 U.S.C. 154(b) by 899 days.

(21) Appl. No.: 11/238,040

(22) Filed: Sep. 27, 2005

(51) Int. Cl.
G06F 17/10 (2006.01)
(52) U.S. Cl. .................................. 708/319; 708/316
(58) Field of Classification Search .............. 708/319, 708/316
See application file for complete search history.

(56) References Cited

U.S. PATENT DOCUMENTS

| | | | |
|---|---|---|---|
| 3,473,160 A | 10/1969 | Wahlstrom | |
| 4,871,930 A | 10/1989 | Wong et al. | |
| 4,912,345 A | 3/1990 | Steele et al. | |
| 5,122,685 A | 6/1992 | Chan et al. | |
| 5,128,559 A | 7/1992 | Steele | |
| 5,371,422 A | 12/1994 | Patel et al. | |
| 5,483,178 A | 1/1996 | Costello et al. | |
| 5,689,195 A | 11/1997 | Cliff et al. | |
| 5,744,980 A | 4/1998 | McGowan et al. | |
| 5,754,459 A | 5/1998 | Telikepalli | |
| 5,825,202 A | 10/1998 | Tavana et al. | |
| 5,874,834 A | 2/1999 | New | |
| 6,069,487 A | 5/2000 | Lane et al. | |
| 6,163,788 A * | 12/2000 | Chen et al. | ................. 708/319 |
| 6,215,326 B1 | 4/2001 | Jefferson et al. | |
| 6,362,650 B1 | 3/2002 | New et al. | |
| 6,407,576 B1 | 6/2002 | Ngai et al. | |
| 6,453,382 B1 | 9/2002 | Heile | |
| 6,467,017 B1 | 10/2002 | Ngai et al. | |
| 6,538,470 B1 | 3/2003 | Langhammer et al. | |
| 6,556,044 B2 | 4/2003 | Langhammer et al. | |
| 6,628,140 B2 | 9/2003 | Langhammer et al. | |
| 6,781,408 B1 | 8/2004 | Langhammer | |
| 6,963,890 B2 * | 11/2005 | Dutta et al. | ................. 708/319 |
| 2002/0089348 A1 | 7/2002 | Langhammer | |

FOREIGN PATENT DOCUMENTS

| | | |
|---|---|---|
| EP | 0 461 798 | 12/1991 |
| GB | 2 283 602 | 5/1995 |

OTHER PUBLICATIONS

Altera Corporation, "Implementing Multipliers in FLEX 10K EABs", Technical Brief 5, Mar. 1996.

(Continued)

*Primary Examiner*—Tan V Mai
(74) *Attorney, Agent, or Firm*—Ropes & Gray LLP; Jeffrey H. Ingerman

(57) ABSTRACT

A specialized multiplier block in a programmable logic device incorporates multipliers and adders, and is configurable as one or more types of finite impulse response (FIR) filter including a Direct Form II FIR filter. The specialized multiplier block further includes input and output registers to allow chaining of Direct Form II FIR filters into longer Direct Form II FIR filters. An output accumulator also allows the specialized multiplier block to operate as a time-division multiplexed FIR filter, performing several filtering operations during each clock cycle of the programmable logic device.

26 Claims, 7 Drawing Sheets

OTHER PUBLICATIONS

Altera Corporation, "Implementing Logic with the Embedded Array in FLEX 10K Devices", Product Information Bulletin 21, ver. 2.1, May 2001, pp. 1-20.

Analog Devices, Inc., The Applications Engineering Staff of Analog Devices, DSP Division, *Digital Signal Processing Applications Using the ADSP-2100 Family* (edited by Amy Mar), 1990, pp. 141-92.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

QuickLogic Corporation, "The QuickDSP Design Guide", Rev. B, Aug. 2001, pp. 1-38.

QuickLogic Corporation, "The QuickDSP Family Data Sheet", Rev. B, Aug. 7, 2001, pp. 1-19.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Xilinx Inc., "Xilinx Unveils New FPGA Architecture to Enable High-Performance, 10 Million System Gate Designs", Xilinx Virtex-II Architecture Technology Backgrounder, Jun. 22, 2000, pp. 1-9.

Xilinx Inc., "Xilinx Announces DSP Algorithms, Tools and Features for Virtex-II Architecture", Nov. 21, 2000, pp. 1-4.

Xilinx Inc., "Virtex-II 1.5V Field-Programmable Gate Arrays", Advance Product Specification, DS031-2 (v1.3), Jan. 25, 2001, Module 2 of 4, pp. 1-50.

Xilinx Inc., "Virtex-II 1.5V Field-Programmable Gate Arrays", Advance Product Specification, DS031-1 (v1.5), Apr. 2, 2001, Module 1 of 4, pp. 1-7.

Xilinx Inc., "Virtex-II 1.5V Field-Programmable Gate Arrays", Advance Product Specification, DS031-2 (v1.5), Apr. 2, 2001, Module 2 of 4, pp. 1-36.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-57.

* cited by examiner

US 7,590,676 B1

PROGRAMMABLE LOGIC DEVICE WITH SPECIALIZED MULTIPLIER BLOCKS

BACKGROUND OF THE INVENTION

This invention relates to programmable logic devices that include specialized multiplier blocks that can be configured as finite impulse response (FIR) filters, and more particularly to such programmable logic devices in which the specialized multiplier blocks may be interconnected to create larger filters.

As programmable logic devices have become larger, it has become more common to add dedicated blocks to perform particular functions that have become more common in programmable logic devices. For example, at some point, such devices began to be provided with embedded blocks of random access memory that could be configured by the user to act as random access memory, read-only memory, or logic (such as sum-of-products logic, otherwise known as product term or P-TERM logic); such embedded blocks might even be provided in different sizes on the same device. Other types of memory, such as read-only memory (ROM) or shift registers, also have been provided. More recently, multiplier circuits have been provided on programmable logic devices. Whereas in prior programmable logic devices space was not available for dedicated multipliers, current larger devices can accommodate multipliers. This spares users from having to create multipliers by configuring the available logic. Moreover, as described in commonly-assigned U.S. Pat. No. 6,538,470, which is hereby incorporated by reference in its entirety, specialized multiplier blocks may be provided including multipliers and other arithmetic circuits such as adders and/or subtracters and/or accumulators. Such blocks are sometimes referred to as "multiplier-accumulator blocks" or "MAC blocks." Such blocks, for example, may be useful in digital signal processing, such as is performed in audio applications, and therefore such specialized multiplier blocks also are sometimes referred to as "DSP blocks."

One use for such specialized multiplier blocks is in filtering operations. In particular, one such specialized multiplier block described in commonly-assigned U.S. Pat. No. 6,556,044, can be configured as either a Direct Form I FIR filter or as a Direct Form II FIR filter. As seen there, in a Direct Form I FIR filter, several multiplier outputs are added using an adder chain, which also provides for chaining to the adder chain of another specialized multiplier block to create longer Direct Form I FIR filters. Indeed, a Direct Form I FIR filter of any length (up to the limit imposed by the number of specialized multiplier blocks on the programmable logic device) can be created.

On the other hand, as also seen there, a Direct Form II FIR filter uses an adder tree rather than an adder chain. Creating longer filters would require an adder tree outside the specialized multiplier blocks to add the results from plural specialized multiplier blocks. Because it is not known in advance how many blocks a user may want to add together, and because such adder trees consume large device areas, it is not practical to provide such adder trees on a programmable logic device. As a result, users who want to construct long Direct Form II FIR filters must use soft logic of the programmable logic device to construct the required adder tree. While this allows creation of an adder tree of any size, soft logic adders are slower, and consume a large amount of device resources.

It would be desirable to be able to provide a specialized multiplier block on a programmable logic device that allows large Direct Form II FIR filters to be constructed.

SUMMARY OF THE INVENTION

The present invention achieves greater flexibility in the use of a specialized multiplier block of the type described above to create different types of FIR filters. A specialized multiplier block according to the invention preferably includes a registered output of the local adder tree which can be propagated to a registered input of a subsequent similar block. The registration lines up the output in time as between the two blocks and thereby allows such an arrangement to be used to form large FIR filters without an external adder tree. The size of the FIR filter is limited only by the number of available blocks.

In addition, by providing at one such a block with an accumulator at the output, the invention takes advantage of the ability of the adders and multipliers in the block to run faster than the system clock to provide a time-division multiplexed (TDM) FIR filter where multiple sets of data and coefficients are processed on each system clock cycle. Because the normal input register chain operates on the system clock, for this TDM FIR filter the inputs are taken from the soft logic regions of the programmable logic device.

Therefore, in accordance with the present invention, there is provided a specialized multiplier block for use in a programmable logic device. The specialized multiplier block preferably includes a plurality of multipliers having multiplier inputs, and at least one input register chain, at least one input of each of the multipliers being connected to the input register chain. The block also includes a plurality of adders, and programmable connections between the multipliers and the adders. The specialized multiplier block is configurable as a Direct Form II finite impulse response filter. An output register for chaining output of the Direct Form II finite impulse response filter to another one of the specialized multiplier block is also included. The specialized multiplier block is thereby configurable with others of the specialized multiplier block as a long Direct Form II finite impulse response filter.

A programmable logic device incorporating the specialized multiplier block is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-7.

Figure 1:
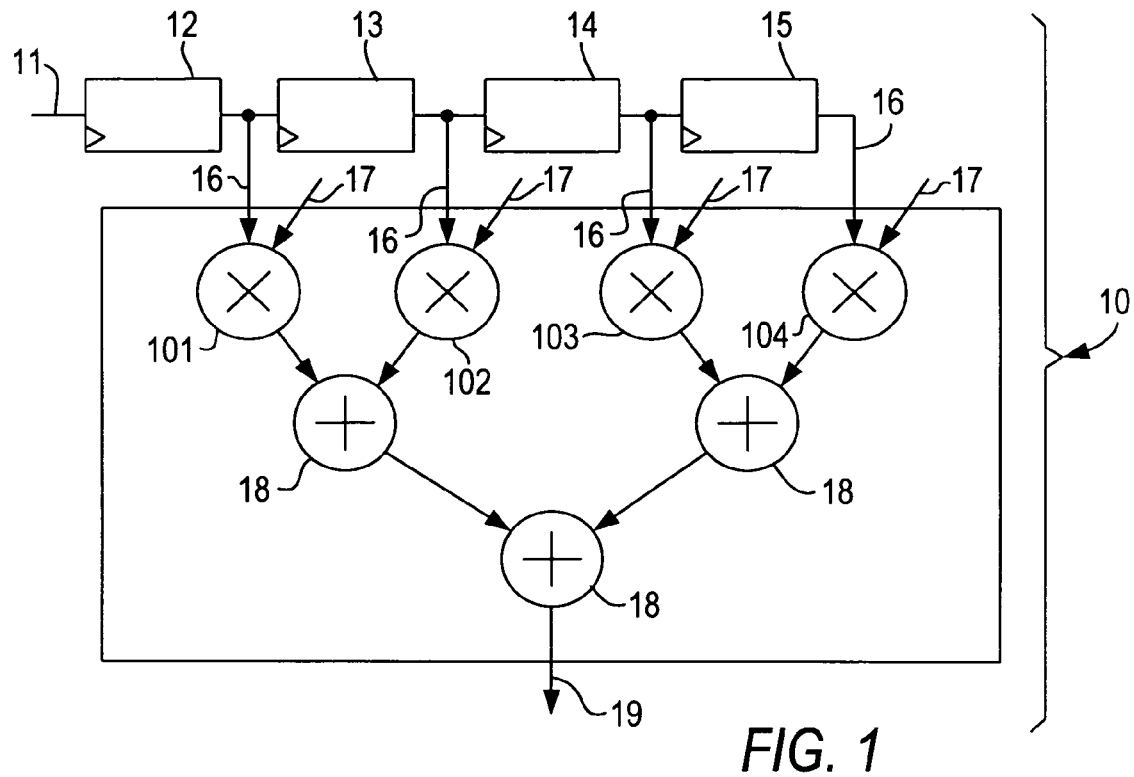
FIG. 1 is a schematic representation of a previously known specialized multiplier block configured as a Direct Form II FIR filter.

FIG. 1 shows a schematic representation of a previously known specialized multiplier block 10, of a type shown in commonly-assigned U.S. Pat. No. 6,556,044, which is hereby incorporated by reference herein in its entirety. In the representation shown in FIG. 1, specialized multiplier block 10 is configured as a Direct Form II finite impulse response (FIR) filter. Data is input at 11 to chain of input registers 12, 13, 14, 15, and one input 16 of each of multipliers 101, 102, 103, 104 is input from the register chain. The other inputs 17 of multipliers 101-104 represent the coefficients of the FIR filter, any may be stored or computed elsewhere, such as in the soft logic of a programmable logic device of which specialized multiplier block 10 is a part. A tree of adders 18 sum the outputs of multipliers 101-104 to provide the filter output 19.

Figure 2:
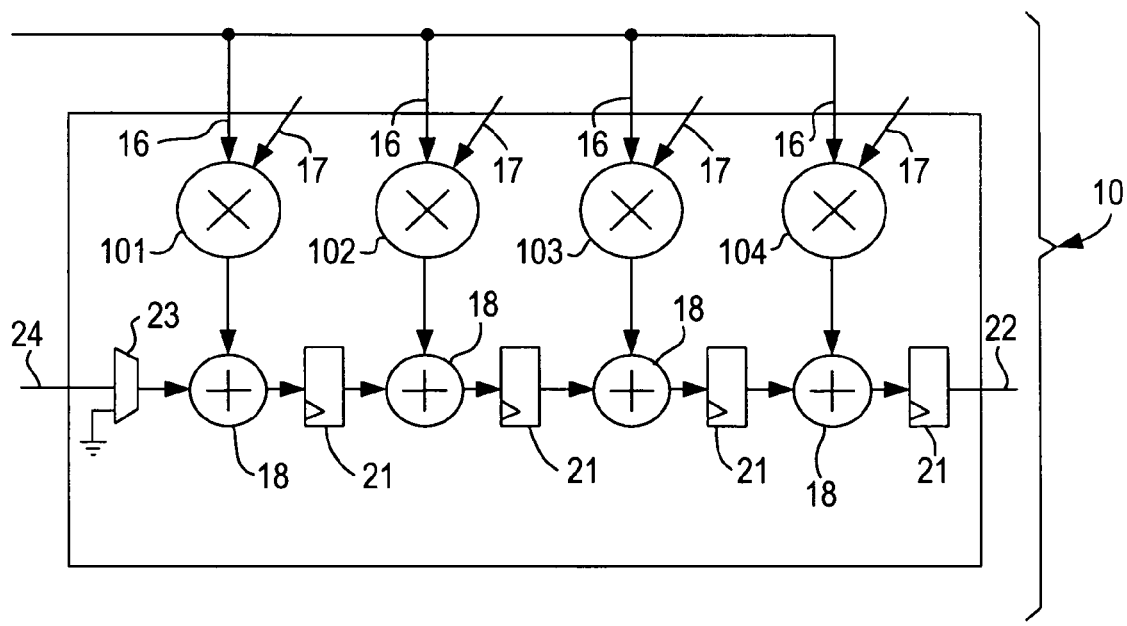
FIG. 2 is a schematic representation of a previously known specialized multiplier block configured as a Direct Form I FIR filter.

As an alternative, FIG. 2 shows a schematic representation of specialized multiplier block 10 configured as a Direct Form I finite impulse response (FIR) filter. Once again the coefficients are input at 17 to multipliers 101-104, while the data are input simultaneously at 16 to each multiplier 101-104, without registration. Instead of a tree of adders 18, a chain of adders 18, registered by registers 21, adds the multiplier outputs to form the filter output 22.

Specialized multiplier block 10 preferably contains a plurality of registers and programmable logic connectors (e.g., multiplexers) that allow for the different configurations shown as well as other configurations. The details of one embodiment of a suitable specialized multiplier block is shown in commonly-assigned U.S. Pat. No. 6,781,408, which is hereby incorporated by reference in its entirety.

Figure 3:
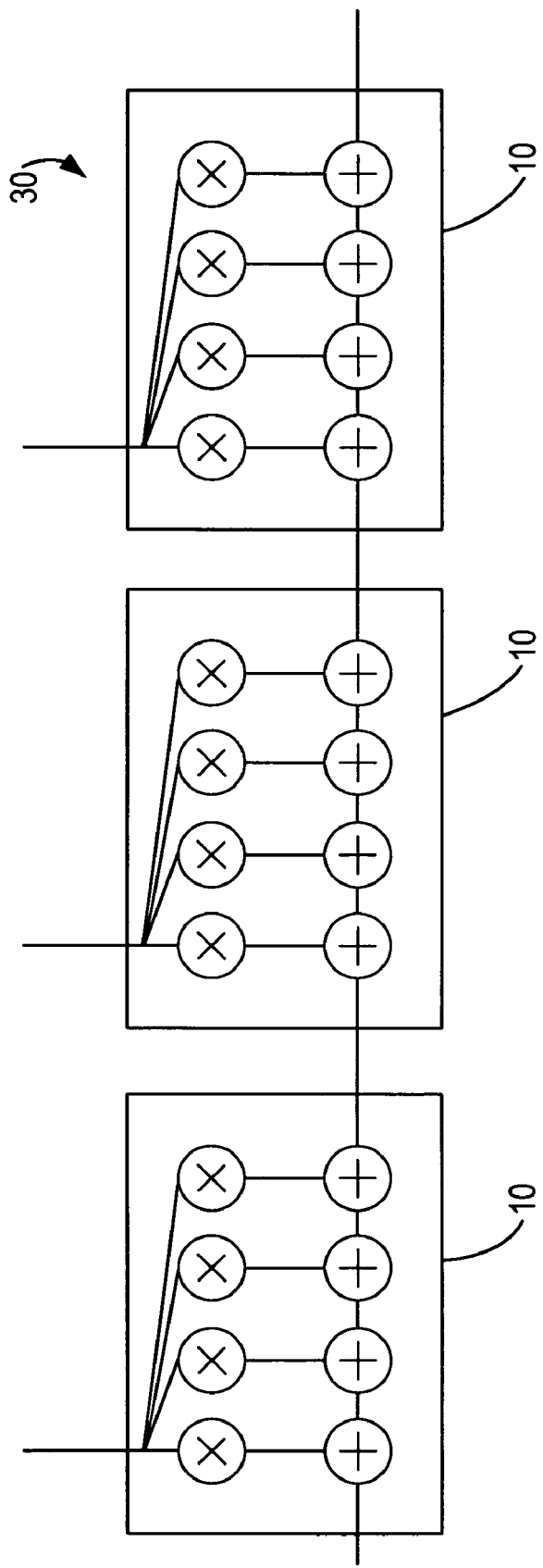
FIG. 3 is a schematic representation of a plurality of specialized multiplier blocks as in FIG. 2 chained to form a long Direct Form I FIR filter.

As seen in FIG. 3, several Direct Form I FIR filters of the type shown in FIG. 2 may easily be chained together to form a longer Direct Form I FIR filter. Multiplexer 23 accepts output 22 of a previous block 10 as input 24 to the adder chain. In that one of blocks 10 that is the first in the chain 30 of blocks 10, multiplexer 23 can select ground (i.e., zero) as the input to the adder chain.

Figure 4:
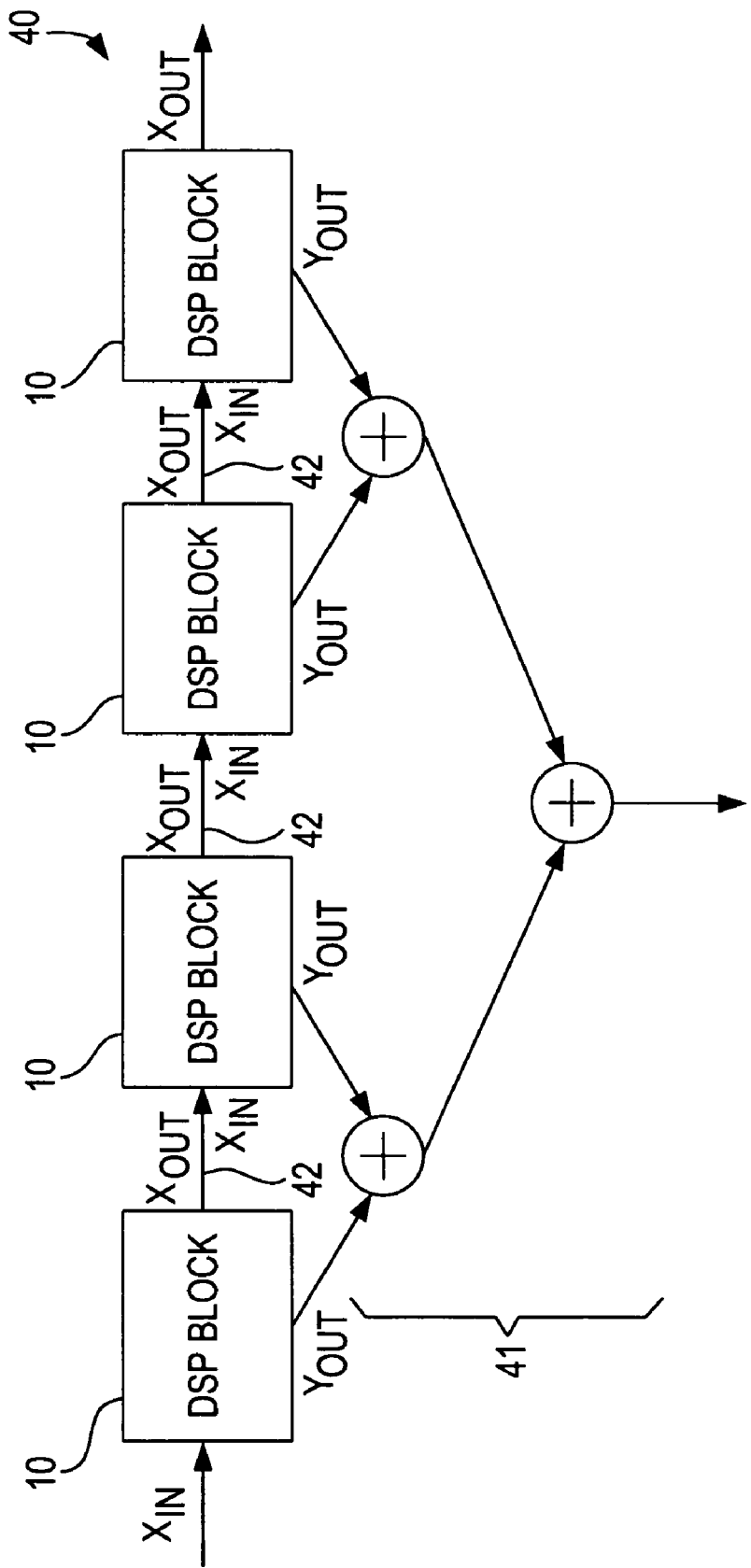
FIG. 4 is a schematic representation of a plurality of specialized multiplier blocks as in FIG. 1 arranged to form a long Direct Form II FIR filter.

Longer Direct Form II FIR filters may not be created so easily from blocks 10 as longer Direct Form I FIR filters. As seen in FIG. 4, in order to create a longer Direct Form II FIR filter 40, an external adder tree 41 is normally used to add the outputs of blocks 10, although the input register chains may be connected at 42. The creation of large adder chains in the soft logic of the programmable logic device consumes significant programmable logic device resources.

Figure 5:
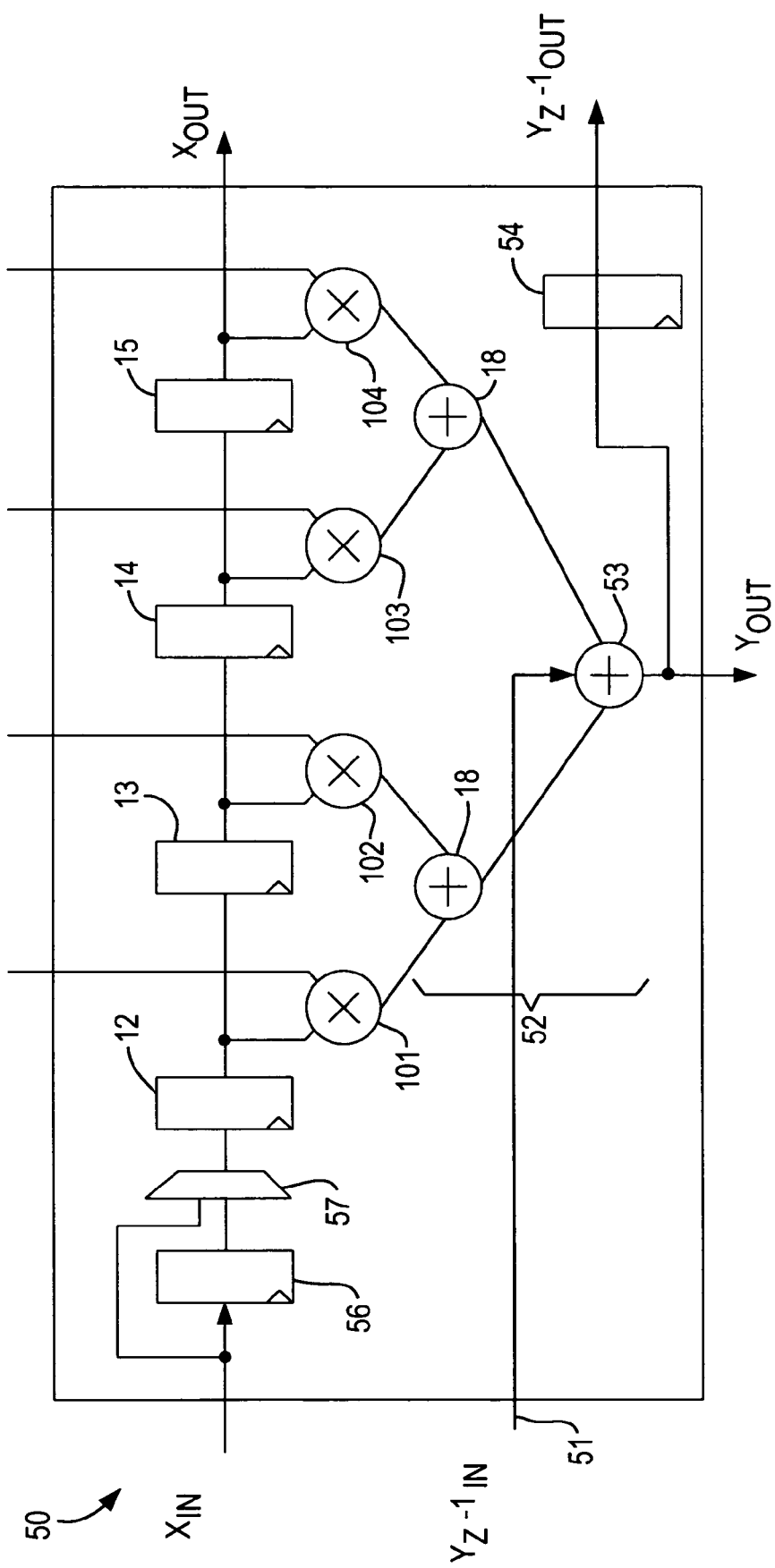
FIG. 5 is a schematic diagram of a preferred embodiment of a specialized multiplier block in accordance with the present invention.
Figure 6:
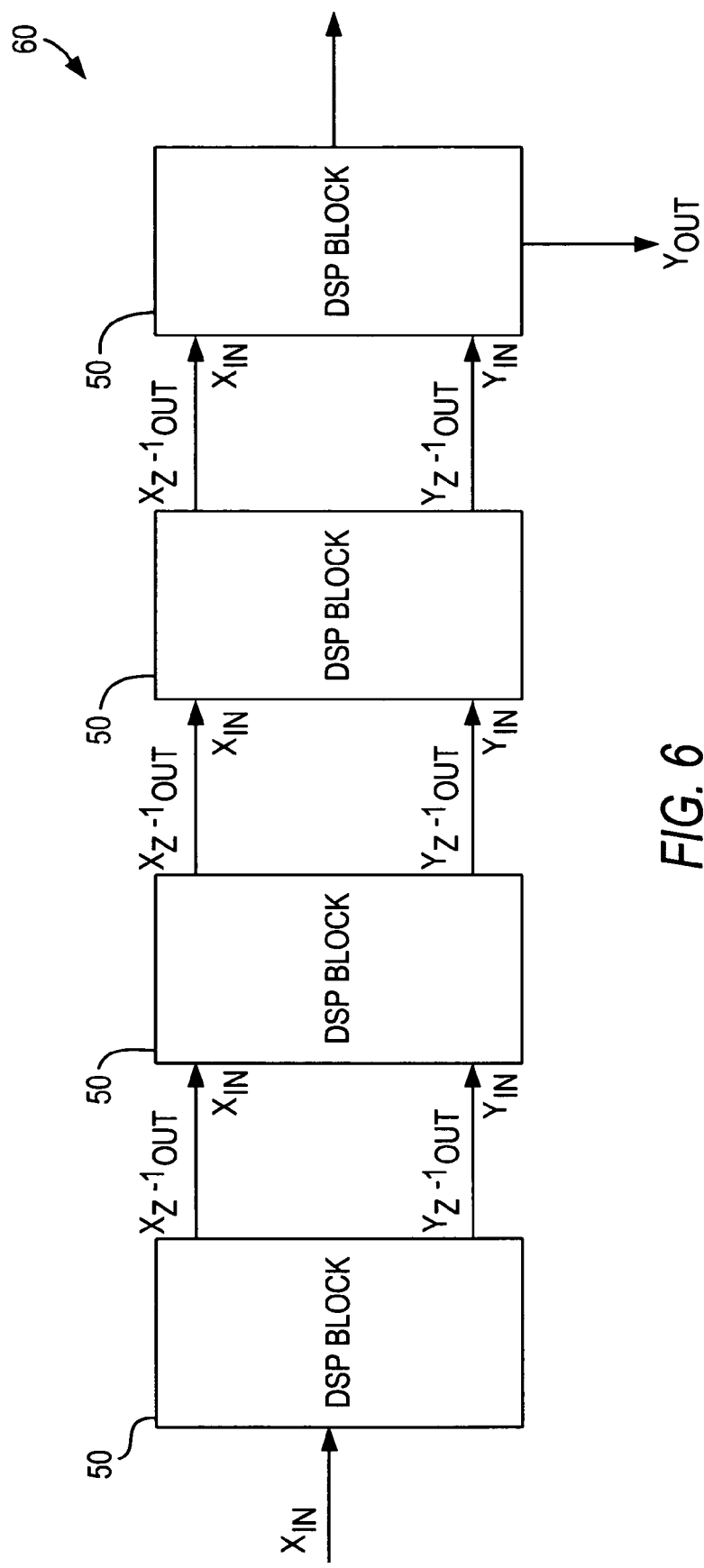
FIG. 6 shows how a plurality of the specialized multiplier blocks of FIG. 5 may be chained together as a long Direct Form II FIR filter.

Specialized multiplier block 50 according to the present invention, shown in FIG. 5, preferably allows the creation of longer Direct Form II FIR filters without an external adder tree, conserving programmable logic device resources. Block 50 preferably includes an additional input 51 from outside block 50 to final adder 53 of the block's internal adder tree 52. An output register 54 preferably is provided to register the output of adder 53. That output may be input to additional input 51 of adder 53 of another one of specialized multiplier block 50. If the output of specialized multiplier block 50 is thus registered and chained to the next block, the data samples in input registers 12-15 (FIG. 1), preferably should be delayed by the same amount so that the multiplier results line up with the incoming sum of multiplies from the previous specialized multiplier block. Therefore, specialized multiplier block 50 preferably also has a supplemental input register 56 on the input register chain 55, which may be selectably included, using multiplexer 57, in input register chain 55 when blocks 50 are being chained to form a long Direct Form II FIR filter. As seen in FIG. 6, a plurality of special multiplier blocks 50 can be chained to form a long Direct Form II FIR filter 60 in a manner similar to the way they may be chained to form a long Direct Form I FIR filter (cf., FIG. 3).

Figure 7:
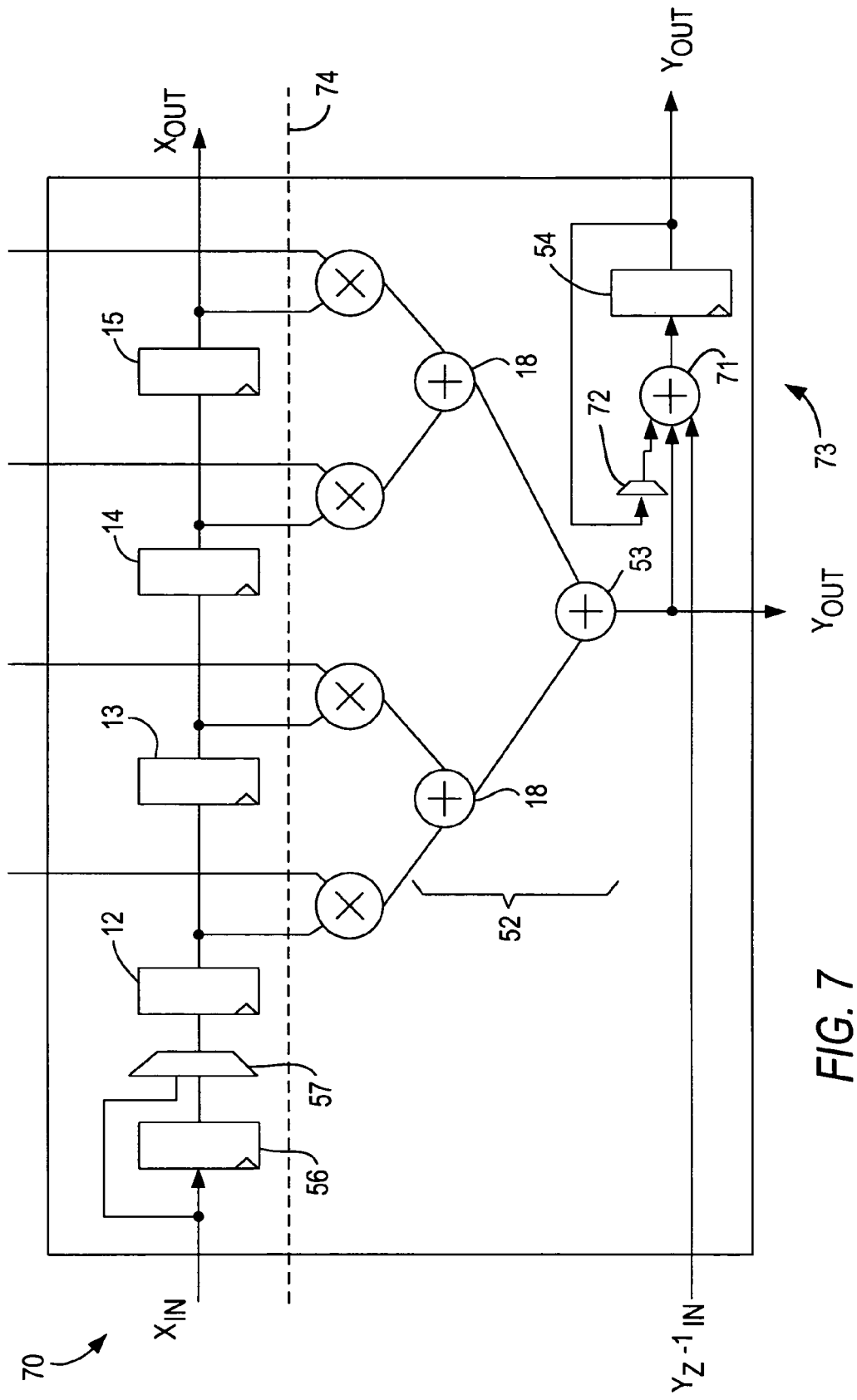
FIG. 7 is a schematic diagram of another preferred embodiment of a specialized multiplier block in accordance with the present invention.

A further embodiment of a specialized multiplier block 70 according to the invention is shown in FIG. 7, and takes advantage of the fact that the components of block 70 in some cases may be able to operate at clock speeds several times those of the programmable logic device of which block 70 is a part. Specialized multiplier block 70 includes a further adder 71 and multiplexer 72 that, in combination with output register 54, can be used to form an accumulator 73, which helps utilize this speed advantage to form a time-division multiplexed Direct Form II FIR filter that performs a plurality of filter cycles within one block 70 (and within one cycle of the programmable logic device clock), if a clock faster than the programmable logic device clock is provided. This could allow the formation of a long Direct Form II FIR filter without using more than one block 70.

Because input register chain 55 of block 70 is clocked by the programmable logic device clock, it operates, by definition, at the speed of that clock. Therefore, in a time-division multiplexed FIR filter implementation, the data as well as coefficients of the filter preferably come from outside block 70. Thus, the portion of block 70 above line 74 preferably is not used. As one example, the data may be input from a series of FIFO memories in the programmable logic device between the specialized multiplier blocks. Similarly, the faster clock needed to operate the time-division multiplexed filter, which preferably would be substantially a multiple of the programmable logic device clock, preferably is generated outside block 70, and either inside or outside the programmable logic device. Where, as here, specialized multiplier block 70 is used with registers external to block 70, supplemental input register 56 also may be implemented outside block 70.

Specialized multiplier blocks 50 and 70 preferably contain a plurality of registers and programmable logic connectors (e.g., multiplexers) that allow for the different configurations shown as well as other configurations. The details of one embodiment of a suitable specialized multiplier block, which can be implemented as either block 50 or block 70 is shown in copending, commonly-assigned U.S. patent application Ser. No. 11/208,906 filed concurrently herewith, which is hereby incorporated by reference in its entirety.

Figure 8:
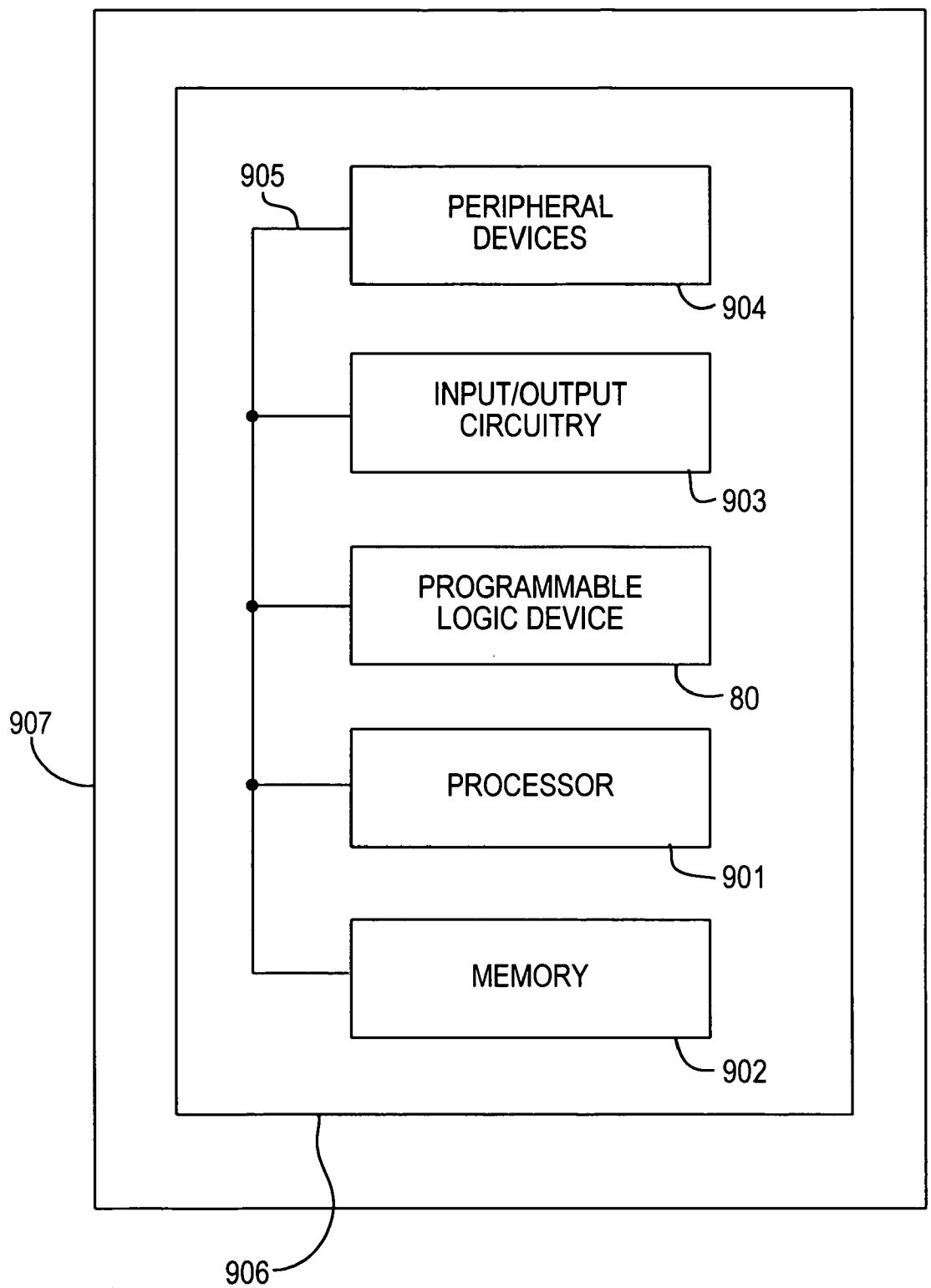
FIG. 8 is a schematic representation of a system including a programmable logic device incorporating the present invention.

A programmable logic device ("PLD") 80 incorporating a specialized multiplier block according to the present invention may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 80 can be used to perform a variety of different logic functions. For example, PLD 80 can be configured as a processor or controller that works in cooperation with processor 901. PLD 80 may also be used as an arbiter for arbitrating access to a shared resources in system 900. In yet another example, PLD 80 can be configured as an interface between processor 901 and one of the other components in system 900. It should be noted that system 900 is only exemplary, and that the true scope and spirit of the invention should be indicated by the following claims.

Various technologies can be used to implement PLDs 80 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A specialized multiplier block for use in a programmable logic device, said specialized multiplier block comprising:
    a plurality of multipliers having multiplier inputs;
    at least one input register chain, at least one input of each of said multipliers being connected to said input register chain;
    a plurality of adders;
    programmable connections between said multipliers and said adders whereby said specialized multiplier block is configurable as a Direct Form II finite impulse response filter; and
    an output register for chaining output of said Direct Form II finite impulse response filter to another said specialized multiplier block; wherein:
    said specialized multiplier block is configurable with others of said specialized multiplier block as a long Direct Form II finite impulse response filter.

2. The specialized multiplier block of claim 1 further comprising a selectably bypassable register at an input to said input register chain; wherein:
    said output register is chainable to one said adder of another of said specialized multiplier block; and
    said input register chain is chainable to said input register chain of said another of said specialized multiplier block via said selectably bypassable register of said another of said specialized multiplier block.

3. The specialized multiplier block of claim 1 further comprising a selectable output accumulator; whereby:
    said specialized multiplier block is configurable as a time-division multiplexed Direct Form II finite impulse response filter.

4. The specialized multiplier block of claim 3 wherein said at least one input of each of said multipliers is selectably connectable to an input other than said input register chain.

5. The specialized multiplier block of claim 4 wherein said input other than said input register chain is programmable logic of said programmable logic device.

6. A programmable logic device comprising the specialized multiplier block of claim 1.

7. A digital processing system comprising:
    processing circuitry;
    a memory coupled to said processing circuitry; and
    a programmable logic device as defined in claim 6 coupled to the processing circuitry and the memory.

8. A printed circuit board on which is mounted a programmable logic device as defined in claim 6.

9. The printed circuit board defined in claim 8 further comprising:
    memory circuitry mounted on the printed circuit board and coupled to the programmable logic device.

10. The printed circuit board defined in claim 9 further comprising:
    processing circuitry mounted on the printed circuit board and coupled to the memory circuitry.

11. An integrated circuit device comprising the specialized multiplier block of claim 1.

12. A digital processing system comprising:
    processing circuitry;
    a memory coupled to said processing circuitry; and
    an integrated circuit device as defined in claim 11 coupled to the processing circuitry and the memory.

13. A printed circuit board on which is mounted an integrated circuit device as defined in claim 11.

14. The printed circuit board defined in claim 13 further comprising:
    memory circuitry mounted on the printed circuit board and coupled to the integrated circuit device.

15. The printed circuit board defined in claim 14 further comprising:
    processing circuitry mounted on the printed circuit board and coupled to the memory circuitry.

16. A specialized multiplier block for use in a programmable logic device, said specialized multiplier block comprising:
    a plurality of multipliers having multiplier inputs;
    at least one input register chain, at least one input of each of said multipliers being connected to said input register chain;
    a plurality of adders;
    programmable connections between said multipliers and said adders whereby said specialized multiplier block is configurable as a Direct Form II finite impulse response filter; and
    an output accumulator selectably connectable to output of said adders; whereby:
    said specialized multiplier block is configurable as a time-division multiplexed Direct Form II finite impulse response filter.

17. A programmable logic device comprising the specialized multiplier block of claim 16.

18. A digital processing system comprising:
    processing circuitry;
    a memory coupled to said processing circuitry; and
    a programmable logic device as defined in claim 17 coupled to the processing circuitry and the memory.

19. A printed circuit board on which is mounted a programmable logic device as defined in claim 17.

20. The printed circuit board defined in claim 19 further comprising:
    memory circuitry mounted on the printed circuit board and coupled to the programmable logic device.

21. The printed circuit board defined in claim 20 further comprising:
    processing circuitry mounted on the printed circuit board and coupled to the memory circuitry.

22. An integrated circuit device comprising the specialized multiplier block of claim 16.

23. A digital processing system comprising:
    processing circuitry;
    a memory coupled to said processing circuitry; and
    an integrated circuit device as defined in claim 22 coupled to the processing circuitry and the memory.

24. A printed circuit board on which is mounted an integrated circuit device as defined in claim 22.

25. The printed circuit board defined in claim 24 further comprising:

memory circuitry mounted on the printed circuit board and coupled to the integrated circuit device.

26. The printed circuit board defined in claim 25 further comprising:

processing circuitry mounted on the printed circuit board and coupled to the memory circuitry.

* * * * *

UNITED STATES PATENT AND TRADEMARK OFFICE
CERTIFICATE OF CORRECTION

PATENT NO. : 7,590,676 B1 Page 1 of 1
APPLICATION NO. : 11/238040
DATED : September 15, 2009
INVENTOR(S) : Martin Langhammer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1023 days.

Signed and Sealed this

Twenty-first Day of September, 2010

David J. Kappos
*Director of the United States Patent and Trademark Office*